(12) United States Patent
Summers et al.

(10) Patent No.: US 6,777,753 B1
(45) Date of Patent: Aug. 17, 2004

(54) CMOS DEVICES HARDENED AGAINST TOTAL DOSE RADIATION EFFECTS

(75) Inventors: Geoffery Summers, Highland, MD (US); Michael Xapsos, Alexandria, VA (US); Eric Jackson, Bowie, MD (US)

(73) Assignee: The United States of America as represented by the Secretary of the Navy, Washington, DC (US)

( * ) Notice: Subject to any disclaimer, the term of this patent is extended or adjusted under 35 U.S.C. 154(b) by 0 days.

(21) Appl. No.: 09/614,682

(22) Filed: Jul. 12, 2000

(51) Int. Cl.⁷ .................. H01L 29/76; H01L 31/113
(52) U.S. Cl. ................. 257/351; 257/504; 257/509; 257/327; 257/347; 257/350; 257/365; 257/366
(58) Field of Search ................ 257/351, 504, 257/509, 327, 347, 350, 365, 366, 650, 921, 297, 543, 53; 327/543, 534, 537

(56) References Cited

U.S. PATENT DOCUMENTS

| | | | | |
|---|---|---|---|---|
| 4,460,835 A | * | 7/1984 | Masuoka | 307/296 |
| 4,506,436 A | | 3/1985 | Bakeman, Jr. et al. | 29/577 |
| 4,670,670 A | | 6/1987 | Shoji | 307/297 |
| 5,103,277 A | | 4/1992 | Caviglia et al. | 357/23.7 |
| 5,289,025 A | * | 2/1994 | Lee | 257/299 |
| 5,289,027 A | * | 2/1994 | Terrill et al. | 257/327 |
| 5,422,507 A | * | 6/1995 | Wanlass | 257/355 |
| 5,501,011 A | | 3/1996 | Pellet | 29/890.01 |
| 5,521,524 A | * | 5/1996 | Houston | 324/765 |
| 5,564,573 A | | 10/1996 | Palm et al. | 209/518 |
| 5,636,133 A | | 6/1997 | Chesebro et al. | 364/491 |
| 5,647,018 A | | 7/1997 | Benjamin | 382/128 |
| 5,682,118 A | | 10/1997 | Kaenel et al. | 327/534 |
| 5,767,549 A | * | 6/1998 | Chen et al. | 257/347 |
| 5,831,865 A | | 11/1998 | Berezin et al. | 364/488 |
| 5,850,090 A | * | 12/1998 | Oashi et al. | 257/296 |
| 5,870,312 A | | 2/1999 | Scepanovic et al. | 364/491 |
| 6,121,651 A | * | 9/2000 | Furukawa et al. | 257/296 |
| 6,274,914 B1 | * | 8/2001 | Park et al. | 257/371 |
| 6,583,470 B1 | * | 6/2003 | Maki et al. | 257/349 |

* cited by examiner

Primary Examiner—Jerome Jackson
Assistant Examiner—Joseph Nguyen
(74) Attorney, Agent, or Firm—John J. Karasek; Rebecca L. Forman

(57) ABSTRACT

A CMOS or NMOS device has one or more n-channel FETs disposed on a substrate, the device being resistant to total dose radiation failures, the device further including a negative voltage source, for applying a steady negative back bias to the substrate of the n-channel FETs to mitigate leakage currents in the device, thereby mitigating total dose radiation effects. A method for operating a CMOS or NMOS device to resist total dose radiation failures, the device having one or more n-channel FETs disposed on a substrate, has the steps: (a) disposing the CMOS or NMOS device in a radiation environment, the radiation environment delivering a dose on the order of tens or hundreds of krad (Si) over the period of use of the CMOS device; and (b) applying a negative back bias to the substrate of the NMOS FETs, at a voltage for mitigating leakage currents about the n-channel FETs.

6 Claims, 5 Drawing Sheets

Figure 1:
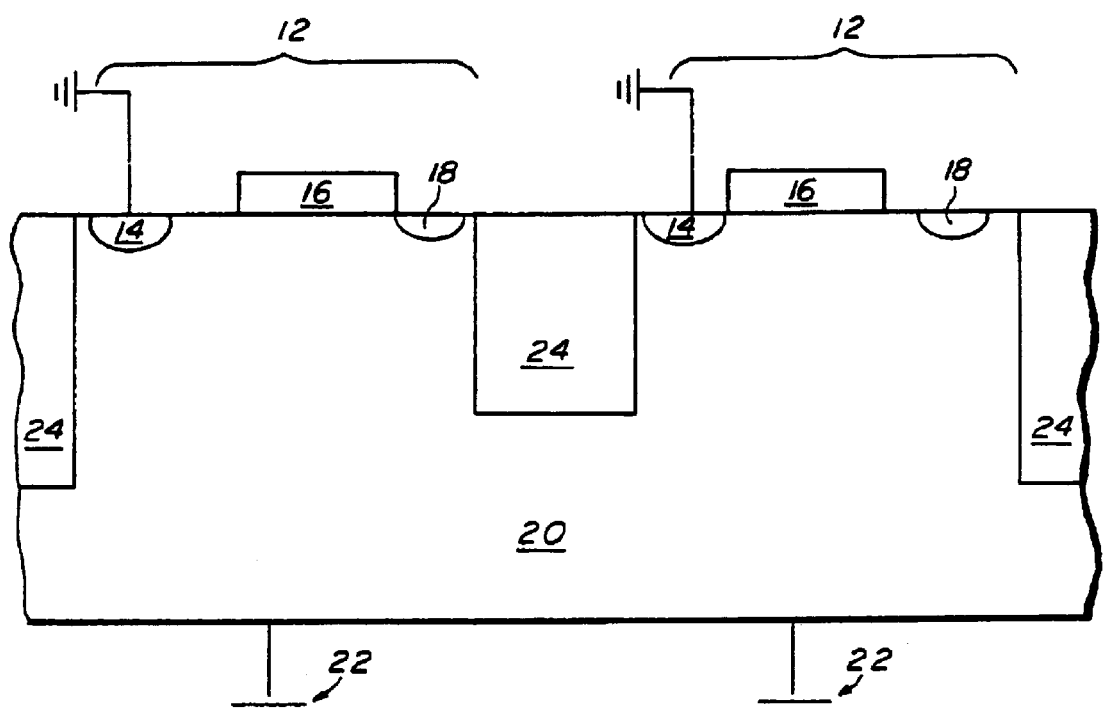

CM OS DEVICES HARDENED AGAINST TOTAL DOSE RADIATION EFFECTS

BACKGROUND OF THE INVENTION

1. Field of the Invention

The present invention relates generally to CMOS devices and circuits, and more particularly to methods and apparatus for hardening the same against total dose radiation effects.

2. Description of the Related Art

Radiation can have harmful effects on microelectronics. For years, practitioners have studied the various ways that different types of radiation affect microelectronics, and have attempted to devise ways of eliminating or at least mitigating the problems that these various types of radiation can create for microelectronics. Three major types of ionizing radiation-induced effects are generally recognized as potential interferents with integrated circuits: total dose effects, dose-rate effects, and soft errors (a.k.a. single event effects). Other non-ionizing radiation effects are also well-documented.

Single event effects occur when a high energy particle (such as a cosmic ray, proton, or neutron) changes the state of a particular device in an integrated circuit, thereby causing a loss of information. Single event effects are localized to a particular region of an integrated circuit.

Dose rate effects are caused by the exposure of an entire integrated circuit to a flood of radiation, typically x- or γ-rays. These are typically related to a short burst (ns to ms) of high intensity radiation, such as that emitted by a nuclear detonation. Such exposure can cause temporary, and in some cases permanent, failure in integrated circuits.

Total dose effects in CMOS and NMOS devices are related to the permanent failure of an integrated circuit caused by an accumulation of radiation dose. Such failure results from the trapping of holes produced by ionizing radiation in the insulating $SiO_2$ region. This can occur in either the gate oxide or the field oxide regions. In modem devices with very thin gate oxides it is far more likely to be the latter. As the name suggests, total dose effects are related to the entire exposure history of integrated circuits—when the total dose exceeds some threshold value, circuit failure is observed. This cumulative nature of total dose effects distinguishes them from single event effects and dose rate effects, which are related instead to short term, transient, phenomena.

For modern commercial CMOS devices, it is known that total dose failure is caused by radiation-generated holes becoming trapped in the field oxide. With increasing dose, a region under the field oxide of the n-channel transistor becomes inverted between the source and the drain, resulting in parasitic leakage currents. Note that the NMOS transistors are the most sensitive part of the CMOS circuit to total dose effects.

Efforts have been made to harden CMOS devices and circuits against total dose effects. Methods include implanting ions into and under oxide layers, introducing defects into oxide layers, and thinning oxide layers. However, because of their invasive nature they are difficult to implement with acceptable device yields. Moreover, these methods all add complex steps to the manufacturing process.

SUMMARY OF THE INVENTION

Accordingly, it is an object of this invention to provide a simple, cost effective method for mitigating total dose effects in CMOS circuits.

It is a further object of this invention to achieve this mitigation without changing the layer structure of the device, such as layer thinning, implantation, or damaging the layers, so that the high performance of the circuit is maintained.

These and additional objects of the invention are accomplished by the structures and processes hereinafter described.

An aspect of the present invention is a CMOS or NMOS device having one or more n-channel FETs disposed on a substrate, the device being resistant to total dose radiation failures, the device further including a negative voltage source, for applying a steady negative back bias to the substrate of the n-channel FETs to mitigate leakage currents in the device, thereby mitigating total dose radiation effects.

Another aspect of the present invention is a method for operating a CMOS or NMOS device to resist total dose radiation failures, the device having one or more n-channel FETs disposed on a substrate, including the steps: (a) disposing the CMOS or NMOS device in a radiation environment, the radiation environment delivering a dose on the order of tens or hundreds of krad (Si) over the period of use of the CMOS device; and (b) applying a steady negative back bias to the substrate of the NMOS FETs, at a voltage for mitigating leakage currents about the n-channel FETs.

BRIEF DESCRIPTION OF THE DRAWINGS

A more complete appreciation of the invention will be obtained readily by reference to the following Description of the Preferred Embodiments and the accompanying drawings in which like numerals in different figures represent the same structures or elements, wherein:

FIG. 1 is a cross-section diagram of an NMOS transistor according to the invention.

FIGS. 2 through 5 plot drain currents versus gate voltages of a device according to the to invention.

DETAILED DESCRIPTION OF THE PREFERRED EMBODIMENTS

To date, most efforts at reducing total dose effects in CMOS devices have been directed at mitigating the effect of total dose radiation on gate oxide layers. However, as transistors have become smaller, the effect of total dose radiation in the field oxide and edge regions has become more important than total dose effects in the gate oxide. This is because modem gate oxides are now so thin, and are anticipated to become even thinner, that irradiation has a greatly reduced effect on their properties. Accordingly, new approaches are needed.

The present invention fits these needs, since it operates to mitigate leakage currents about devices. This approach should be even more advantageous over conventional methods as device sizes continue to shrink. Moreover, as feature sizes (gate thicknesses in particular) continue to decrease, the backbias used in the invention will have less effect on the gate threshold voltage (discussed in greater detail below), thereby reducing the need for process adjustments.

Referring to FIG. 1, an NMOS device 10 includes at least one n-channel field effect transistor (FET) 12, further including a source 14, a drain 18, and a gate 16. The substrate for the device 20 is connected to a negative bias source 22.

The negative bias source 22 is adapted for applying a steady negative back bias to the substrate at a voltage that mitigates total dose radiation failures. The device operates by mitigating leakage currents about the device, while allowing the device to operate within its operational range, i.e., without changing the threshold voltage of the device to a degree that will cause the device to operate poorly. Typically, this negative bias will be between about −3 V and about −0.5 V, relative to the source. The inventors have recognized that in the current generation of commercial CMOS devices, total dose radiation failures arise in the isolation region 24 rather than in the gate region.

Without wishing to be bound by theory, the inventors propose that the reason this method works is that the negative bias raises the threshold voltage in the field (isolation) region and therefore tends to shut off radiation-induced parasitic leakage currents. The field oxide region behaves qualitatively like a second transistor in parallel to the intended transistor and has its own effective threshold voltage that is more strongly affected by the back bias. Larger negative biases will make the devices harder against total dose radiation. However, higher biases will also tend to shift the gate threshold voltage for the FETs in the CMOS device. To compensate for this, the device will typically be engineered so that the threshold voltage is within a preferred operational range (typically between about 0.4 V and about 0.6 V for a device operating at 3 V) when this back bias is applied. However, the method will work for other conditions. For example, it is especially effective with even lower thresholds.

The threshold voltage increases with increasing substrate bias, but the exact relationship will depend on the details of the MOSFET construction. For the simple exemplary case of constant substrate doping and abrupt junctions, the formula for the gate threshold voltage shift due to substrate bias is given by:

$$\Delta V = \frac{\sqrt{2\varepsilon q N_a}}{C} \cdot \left( \sqrt{2|\phi| + |V_{sb}|} - \sqrt{2|\phi|} \right)$$

where $\varepsilon$ is the dielectric constant of the oxide, q is the charge of an electron, $N_a$, is the doping of the NOMS substrate, $\phi$ is the surface potential, $V_{sb}$ is the back bias voltage, and C is the capacitance of the gate. See R. S. Muller and T. I. Kamins, *Device Electronics for Integrated Circuits* ($2^{nd}$., Wiley & Sons, NY, 1986), page 437. The capacitance is inversely proportional to the oxide thickness. If this equation is applied also to the field oxide region, one finds that C is much smaller because the field oxide is much thicker than the gate oxide so the threshold shift of the field oxide region (which can be thought of as a parasitic, parallel transistor) is much larger than the threshold shift of the transistor's gate. The inventors propose that this is why this technique works.

The exact relationship between threshold voltages and the substrate bias voltage will depend on the details of the MOSFET construction and may be determined empirically or by simulation. The substrate bias voltage is typically chosen to be the lowest voltage which reduces the leakage current to acceptable levels over the operating voltage range of the NMOS FET at the specified maximum dose.

The applied negative back bias may be constant (steady) or variable. If steady, the negative back bias typically will be selected to provide protection against the maximum total dose of ionizing radiation against which protection is desired. If variable, the negative back bias will either (a) vary according to some preselected function (e.g., linear) corresponding to the anticipated exposure profile, or (b) vary dynamically as a function of the leakage current or dose as measured by so monitor.

The device 10 operates in a radiation environment. As used herein, a radiation environment is an operational environment where an electronic device is exposed to an average flux of radiation such that it is vulnerable to total dose effects. Radiation environments include (a) earth orbit, (b) altitudes at least 20,000 feet above sea level, (c) industrial, medical, or military environments where there are sufficiently high average fluxes of ionizing radiation that CMOS devices in these environments would be recognized to be at risk of total dose radiation effects.

Having described the invention, the following examples are given to illustrate specific applications of the invention, including the best mode now known to use and perform the invention. These specific examples are not intended to limit the scope of the invention described in this application.

For examples 1, 2, and 3, the transistors were fabricated at American Microsystems, Inc. in Pocatello, Id. on process line C3, a commerical process line that used p-type silicon wafers to produce 3.3 V, 0.35 μm feature size bulk CMOS devices. The production process used local oxidation of silicon (LOCOS) isolation, and had no special steps introduced to improve radiation tolerance. The transistors that were used had a channel length of 0.35 μm and a channel width of 20 μm. The gate oxide thickness was 70 Å and the field oxide thickness was 3500 Å.

EXAMPLE 1

Figure 2:
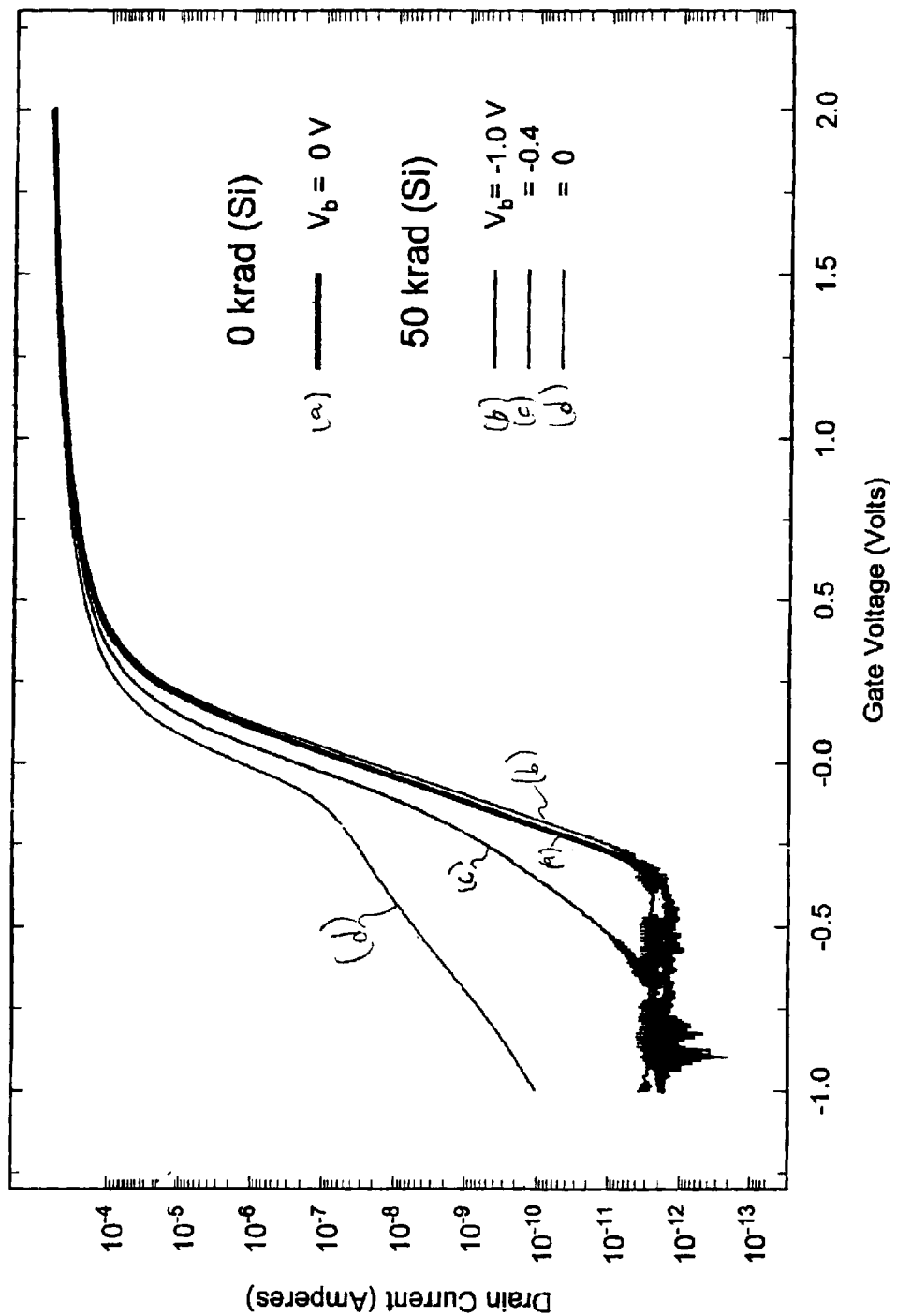

FIG. 2 plots drain currents versus gate voltages of such a device. The device was measured without radiation exposure, and its $I_d$ v. $V_g$ curve was plotted (trace (a)). The device was exposed to the equivalent of 50 krad(Si) of $^{60}$Co γ rays. The $I_d$ v. $V_g$ curve was plotted again, at applied substrate back biases of −1.0 V (trace (b)), −0.4 V (trace (c)), and 0.0 V (trace (d)).

EXAMPLE 2

Figure 3:
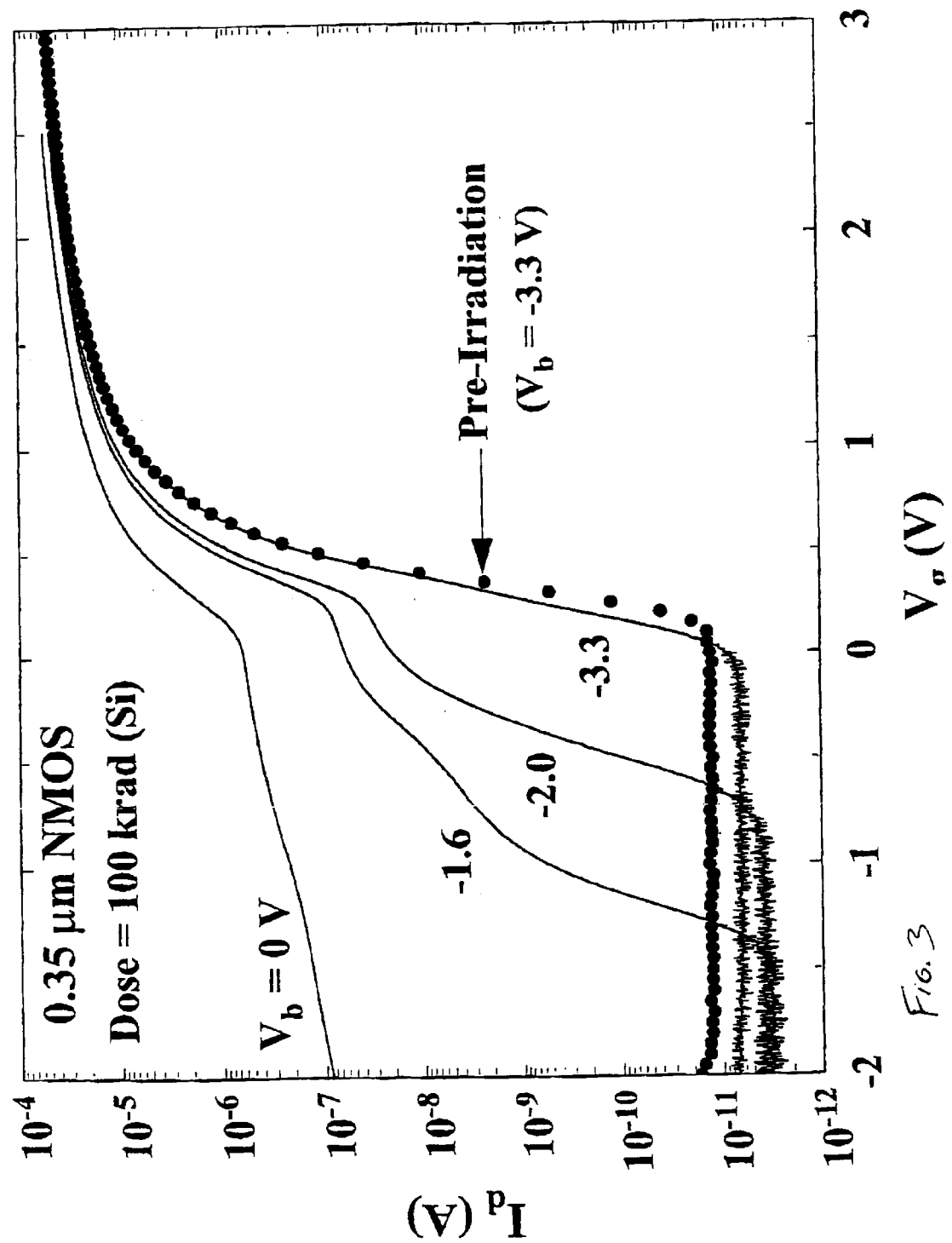

FIG. 3 likewise plots drain currents versus gate voltages of a similar device. The device was measured without radiation exposure, and its $I_d$ v. $V_g$ curve was plotted (points). The device was exposed to an equivalent of 100 krad (Si) of $^{60}$Co γ rays while the n-channel transistor was in the "on" state (3.3 V on the gate relative to the source, drain, and substrate). This represents a worst-case bias condition from a total-dose standpoint. The $I_d$ v. $V_g$ curve was measured again, at applied substrate back biases $V_b$ of −3.3, −2.0, and −1.6 V, as indicated in FIG. 3. The post-irradiation curves show that parasitic leakage currents are very severe with no applied backbias, but are increasingly suppressed with increasing backbias.

This example demonstrates the ability of the invention to protect CMOS devices against a dose of at least 100 krad (Si).

EXAMPLE 3

Figure 4:
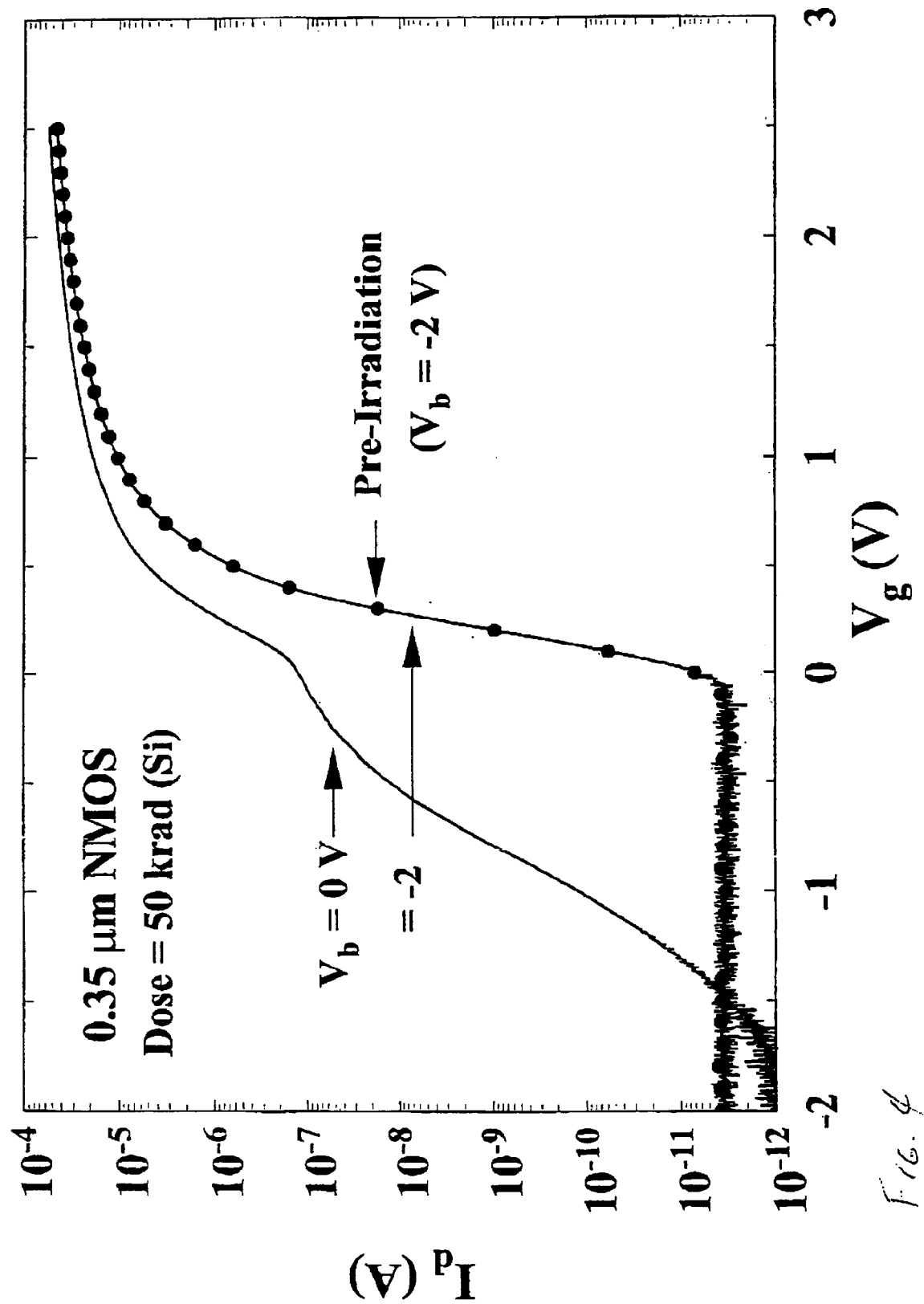

FIG. 4 likewise plots drain currents versus gate voltages of the device in FIG. 2. This figure shows results obtained while backbias is continuously applied during irradiation, as is envisioned for most applications. During irradiation (50 krad (Si)), 3.3 V was applied to the gate relative to the source and drain. In addition, a −2.0 V backbias was applied to the substrate relative to the source and drain. As indicated, the dots represent the pre-irradiation curve, with applied backbias. The two solid traces show the post-irradiation $I_d$ v. $V_g$ behavior, with backbias maintained (labelled $V_b$=−2), and after backbias was removed (labelled $V_b$=0 V).

One sees that the pre- and post-irradiation $I_d$ v. $V_g$ curves are virtually identical, as long as backbias is maintained on the transistor. When the backbias was removed, however, substantial radiation-induced leakage currents were present. This demonstrates that the invention operates to mitigate (or even eliminate) total dose effects of at least 50 krad (Si) by applying a steady negative back bias. This demonstrates that application of back-bias during irradiation does not significantly accelerate the damage due to the radiation while still mitigating the leakage current which is a symptom of that damage.

EXAMPLE 4

As noted above, application of a negative back bias will shift the threshold voltage for n-channel FETs, which degrades performance. Allowances may be made for this phenomenon in circuit manufacture, however. For this example, the transistors were again fabricated at American Microsystems, Inc. These transistors, however, were made to have a threshold voltage of +0.30 V on the application of a −2V back bias. Without this back bias, the threshold voltage was about +0.08 V.

Irradiation (200 krad (Si)) was done with the transistor in the "off" state, and with −2V back bias.

Figure 5:
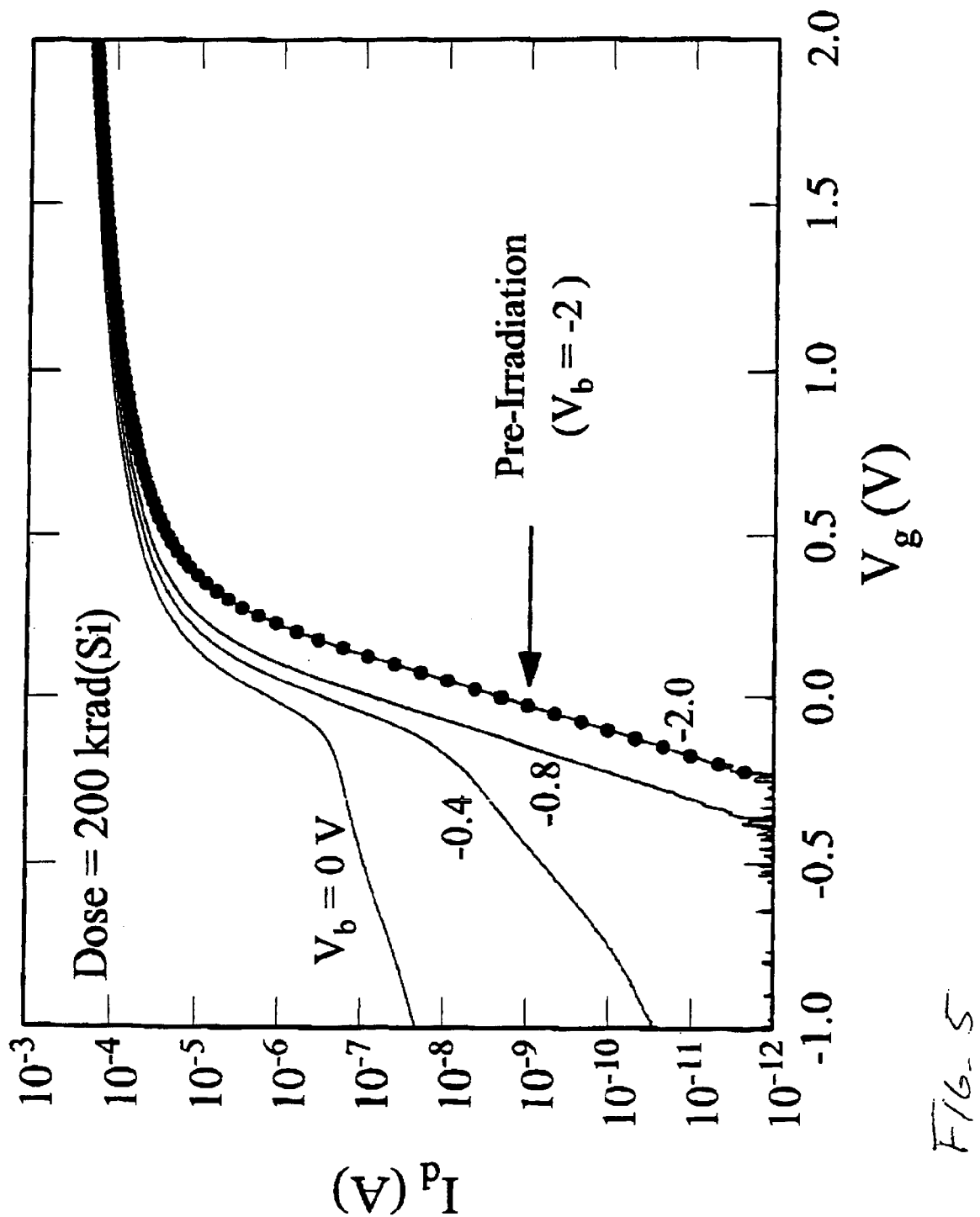

FIG. 5 plots drain currents versus gate voltages of this device. One sees that after irradiation, the pre- and post-irradiation curves are identical, so long as the −2V back bias is applied. This demonstrates that the invention works with n-channel devices that are made to have reduced gate threshold voltage via process adjustments.

Obviously, many modifications and variations of the present invention are possible in light of the above teachings. Specifically, the invention should be applicable to isolation processes besides LOCOS, such as shallow trench isolation, for example. In addition, it should be applicable to further improve radiation resistance and simplify processing of devices to circuits that are already radiation hardened. It is therefore to be understood that, within the scope of the appended claims, the invention may be practiced otherwise than as specifically described.

What is claimed is:

1. A method for operating a bulk CMOS or NMOS device to resist total dose radiation effects due to charge build up in a field oxide, said method comprising the steps of:

selecting a maximum ionizing radiation dose for operation of said bulk CMOS or NMOS device, wherein said CMOS or NMOS device comprises a Si substrate; two or more FETs on said substrate; a field oxide region separating each FET; a negative voltage source for applying a steady negative back bias to a NMOS region of said substrate and for increasing the threshold voltage of the field oxide region to reduce leakage currents due to radiation damage in said field oxide region thereby mitigating total dose radiation effects, and wherein a bulk CMOS device does not include an insulator beneath said FETs; and determining and applying said negative back bias to said substrate of NMOS components of said bulk CMOS or NMOS device, wherein said negative back bias is sufficient to essentially eliminate leakage currents due to total dose radiation in said field oxide region of said CMOS or NMOS device thereby providing hardness against said maximum ionizing radiation dose.

2. The method of claim 1, wherein said back bias is less than the breakdown voltage of drain-substrate and source-substrate junctions.

3. The method of claim 1, wherein said back bias is between about −5 V and about −0.1 V.

4. The method of claim 1, wherein said back bias is between about −3V and about −1 V.

5. The method of claim 1, wherein said CMOS or NMOS device has a threshold voltage within a selected operating range while steady negative back bias is applied.

6. The method of claim 1, wherein said between 0 and 0.8 V while said steady negative back bias is applied.

* * * * *